United States Patent [19]
Watanabe

[11] Patent Number: 5,656,520
[45] Date of Patent: Aug. 12, 1997

[54] SEMICONDUCTOR DEVICE AND METHOD OF MANUFACTURING THE SAME

[75] Inventor: Takeshi Watanabe, Tokyo, Japan

[73] Assignee: NEC Corporation, Japan

[21] Appl. No.: 651,432

[22] Filed: May 22, 1996

Related U.S. Application Data

[63] Continuation of Ser. No. 354,511, Dec. 13, 1994, abandoned.

[30] Foreign Application Priority Data

Dec. 15, 1993 [JP] Japan ................... 5-342853

[51] Int. Cl.$^6$ .................................. H01L 21/336
[52] U.S. Cl. ..................... 438/305; 438/231; 438/970
[58] Field of Search ........................ 437/34, 41 RLD, 437/44, 41 SW, 56, 57, 41 SM

[56] References Cited

U.S. PATENT DOCUMENTS

| | | | |
|---|---|---|---|
| 5,006,477 | 4/1991 | Farb | 437/34 |
| 5,393,685 | 2/1995 | Yoo et al. | 437/44 |

FOREIGN PATENT DOCUMENTS

| | | | |
|---|---|---|---|
| 63-196070 | 8/1988 | Japan | 437/34 |
| 2-168650 | 6/1990 | Japan | 437/34 |
| 2-267943 | 11/1990 | Japan | 437/44 |

*Primary Examiner*—Mary Wilczewski
*Attorney, Agent, or Firm*—Hayes, Soloway, Hennessey, Grossman & Hage, P.C.

[57] ABSTRACT

A semiconductor device and method for manufacturing same are provided. The method according to the present invention begins by sequentially forming in an element region of a semiconductor substrate a gate insulating film, a gate electrode, and a stopper film. An insulating interlayer is formed on the semiconductor substrate and is subsequently etched to remove it from the element region. An impurity is doped into the semiconductor substrate surrounded by the gate electrode and the insulating interlayer to form lightly doped diffusion layers. A sidewall spacer is formed on the sidewalls of the gate electrode and the insulating interlayer. An impurity is doped into the semiconductor substrate surrounded by the sidewall spacers to form heavily doped diffusion layers. Finally, electrode wiring is formed on the semiconductor device surrounded by the sidewall spacers.

6 Claims, 6 Drawing Sheets

1

SEMICONDUCTOR DEVICE AND METHOD OF MANUFACTURING THE SAME

This is a continuation of application Ser. No. 08/354,511 filed on Dec. 13, 1994, now abandoned.

BACKGROUND OF THE INVENTION

1. Field of the Invention

The present invention relates to a semiconductor device and a method of manufacturing the same and, more particularly, to a MOS transistor subjected to micropatterning and a method of manufacturing the same.

2. Description of the Prior Art

The structure of a conventional MOS transistor, particularly a conventional CMOS transistor, will be described in accordance with its manufacturing process. First of all, as shown in FIG. 1A, boron is ion-implanted in a p-type silicon substrate 21 at 150 KeV and about 1E13 $cm^{-2}$, and phosphorous is ion-implanted only in an n-type well formation region at 150 KeV and about 2E13 $cm^{-2}$ by a lithographic process. The resultant structure is annealed to diffuse phosphorous and boron, thereby forming an n-type well region 23 and a p-type well region 22. A field oxide region 24 is formed on the p-type silicon substrate 21, and the resultant structure is isolated to form element regions. Thereafter, a gate oxide region 25 and a gate electrode 26 are formed in each element region.

Next, a resist film 30A is formed in the n-type well region 23 by a lithographic process, and phosphorous is ion-implanted at 40 KeV and about 1.5E13 $cm^{-2}$. Similarly, as shown in FIG. 1B, a resist film 30B is formed in the p-type well region 22 by a lithographic process, and boron is ion-implanted at 15 KeV and about 1.5E13 $cm^{-2}$. Thereafter, the resultant structure is annealed to form an n-type LDD diffusion layer 31 and a p-type LDD diffusion layer 32.

As shown in FIG. 1C, an oxide film is grown on the entire surface to have a thickness of about 200 nm, and the resultant structure is etched back to form an LDD side wall oxide spacer 33. A resist film 30C is formed in the n-type well region 23 by a lithographic process, and arsenic ions are selectively implanted in the p-type well region 22 at 50 KeV and about 3E15 $cm^{-2}$.

Similarly, as shown in FIG. 1D, a resist film 30D is formed in the p-type well region 22 by a lithographic process, and boron fluoride ions are selectively implanted in the n-type well region 23 at 70 KeV and about 3E15 $cm^{-2}$. After the ion implantation, the resultant structure is annealed at about 900° C. to form an $n^+$-type diffusion layer 34 and a $p^+$-type diffusion layer 35 as source and drain regions.

As shown in FIG. 1E, an insulating interlayer 29 is deposited on the entire surface by a CVD method. The resultant structure is annealed to reflow the insulating interlayer 29, thereby planarizing the surface. Subsequently, a resist film 30E is formed by a lithographic process. As shown in FIG. 1F, contact holes are formed in the upper portion of the insulating interlayer 29 on the $n^+$-type diffusion layer 34 and the $p^+$-type diffusion layer 35 using the resist film 30E. After the formation of the contact holes, a resist film 30F is formed on the $p^+$-type diffusion layer 35 by a lithographic process, and phosphorous ions are implanted only in the $n^+$-type diffusion layer 34 portion through the contact hole at 70 KeV and about 5E15 $cm^{-2}$.

In the same manner, as shown in FIG. 1G, a resist film 30G is formed on the $n^+$-type diffusion layer 34 portion by a lithographic process, and boron ions are implanted only in the $p^+$-type diffusion layer 35 through the contact hole at 30 KeV and about 5E15 $cm^{-2}$. After the implantation, the resultant structure is annealed at about 850° C. to form an $n^+$-type contact diffusion layer 37 and a $p^+$-type contact diffusion layer 38.

Finally, as shown in FIG. 1H, a wiring silicide is deposited by sputtering, and the resultant structure is etched by a lithographic process to form an electrode wiring 36, thereby completing a MOS transistor.

In the above manner, according to the conventional manufacturing method, when the n-type diffusion layer 34 and the p-type diffusion layer 35 as the source and drain regions, and the electrode wiring 36 which is to be connected to these layers are micropatterned, an n-type impurity and a p-type impurity are ion-implanted through the formed contact holes in order to avoid a leakage current caused by a positional shift between these layers and the contact holes, thereby forming the contact diffusion layers 37 and 38. For this reason, after the formation of the contact holes, a lithographic process and an ion implantation process are required again, thus complicating the manufacturing process.

Since margins for performing positioning between the diffusion layers 34 and 35 as the source and drain regions and the contact holes are set, the margins become obstacles to micropatterning of the source and drain regions. In addition, the margins do not allow an increase in contact areas, and become obstacles to reduction in contact resistance.

Further, annealing is required in formation of the contact diffusion layer, and annealing for reflowing the insulating interlayer is also required. Therefore, the formed diffusion layers as the source and drain regions are affected by the annealing, undesirably enhancing the influence of the short channel effect.

SUMMARY OF THE INVENTION

The present invention has been made in consideration of the above situation in the conventional technique, and has as its object to provide a semiconductor device wherein a micropatterned MOS transistor can be realized and the manufacturing process can be simplified, and a method of manufacturing the same.

In order to achieve the above object, according to the first aspect of the present invention, there is provided a method of manufacturing a semiconductor device, comprising: the steps of sequentially forming a gate insulating film, a gate electrode, and a stopper film in an element region on a semiconductor substrate; forming an insulating interlayer on the semiconductor substrate, and etching and removing the insulating interlayer in the element region; doping an impurity into the semiconductor substrate surrounded by the gate electrode and the insulating interlayer, and forming lightly doped diffusion layers; forming a sidewall spacer on side walls of the gate electrode and the insulating interlayer; doping an impurity into the semiconductor substrate surrounded by the sidewall spacer, and forming heavily doped diffusion layers; and forming an electrode wiring on the semiconductor device surrounded by the sidewall spacer.

According to the second aspect of the present invention, there is provided a method of manufacturing a semiconductor device, described in the first aspect, wherein the stopper film consists of polysilicon, and further comprising the step of oxidizing the stopper film upon etching and removal of the insulating interlayer.

According to the third aspect of the present invention, there is provided a method of manufacturing a semiconductor device, described in the first aspect, further comprising the step of removing the stopper film at the same time as etching the stopper film.

In the step of forming the lightly doped diffusion layers, described in the first aspect, phosphorous and boron are alternately ion-implanted in different surfaces of the semiconductor device respectively at 40 KeV and about 1.5E13 $cm^{-2}$ and at 15 KeV and about 1.5E13 $cm^{-2}$.

In the step of forming the heavily doped diffusion layers, described in the first aspect, arsenic and boron fluoride are alternately ion-implanted in different surfaces of the semiconductor device respectively at 70 KeV and about 5E15 $cm^{-2}$ and at 30 KeV and about 5E15 $cm^{-2}$.

In addition, annealing is performed at 900° C. so as to activate the diffusion layers after ion implantation.

As has been described above, according to the present invention, the diffusion layers as the source and drain regions are formed on the semiconductor substrate in the regions surrounded by the sidewall spacers formed on the side walls of the gate electrode and the insulating interlayer, and the electrode wiring is formed on the diffusion layers. With this arrangement, the contact holes completely can correspond to the diffusion layers, and no margin for positioning them is required. Therefore, a micropatterned diffusion layer can be realized, and a contact area can be increased. Further, a MOS transistor can be highly integrated, and contact resistance can be reduced.

According to the manufacturing method of the present invention, after the gate electrode and the insulating interlayer are formed, the insulating interlayer in the element region is etched and removed, and the diffusion layers and the contact holes are formed in the region wherein the insulating interlayer has been removed. With this arrangement, the diffusion layers can completely correspond to the contact holes. No step of forming a contact diffusion layer for eliminating leakage current is required, thereby decreasing the number of manufacturing steps. After the diffusion layers as the source and drain regions are formed, the influence of annealing for forming a contact diffusion layer and of annealing for reflowing the insulating interlayer can be eliminated, thereby suppressing the short channel effect.

The above and many other advantages, features and additional objects of the present invention will become manifest to those versed in the art upon making reference to the following detailed description and accompanying drawings in which preferred structural embodiments incorporating the principles of the present invention are shown by way of illustrative example.

DETAILED DESCRIPTION OF PREFERRED EMBODIMENT

Figure 1A:
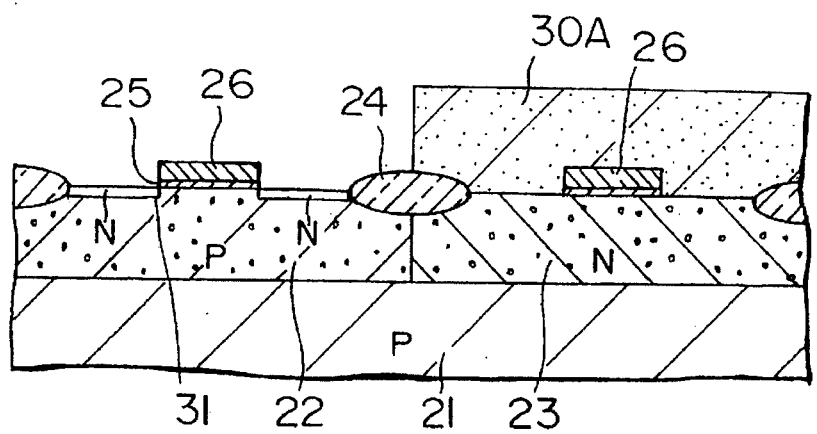
FIGS. 1A to 1H are sectional views sequentially showing the manufacturing steps of a conventional semiconductor device.
Figure 1B:
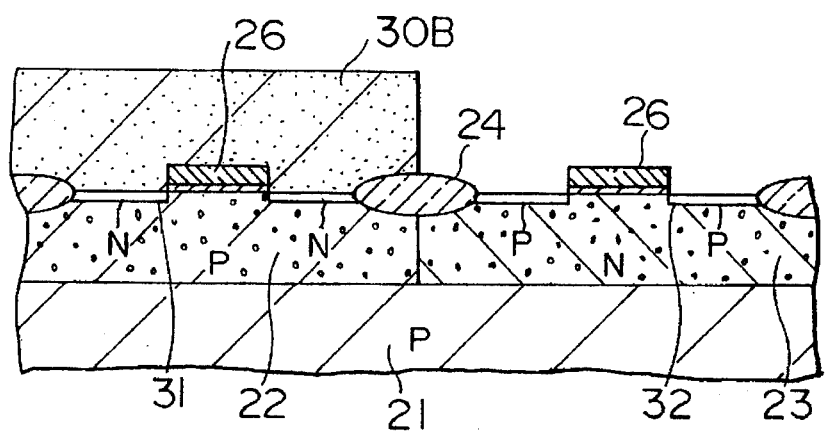
Figure 1C:
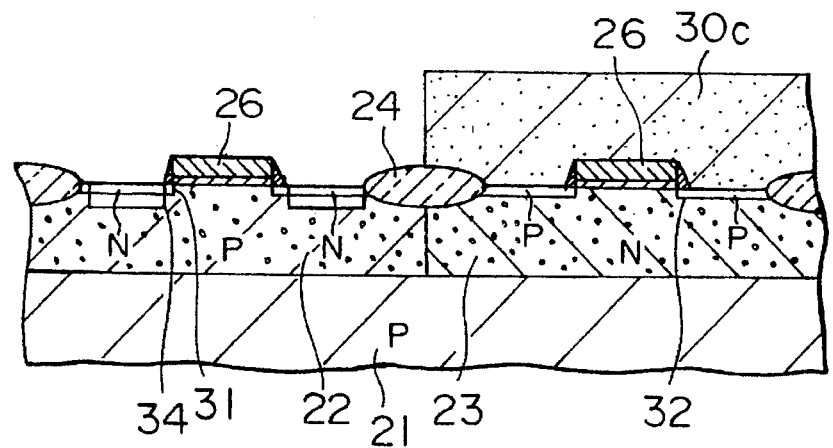
Figure 1D:
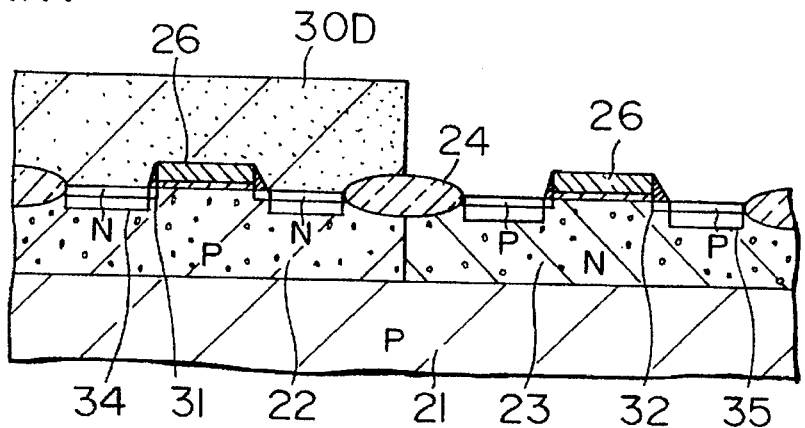
Figure 1E:
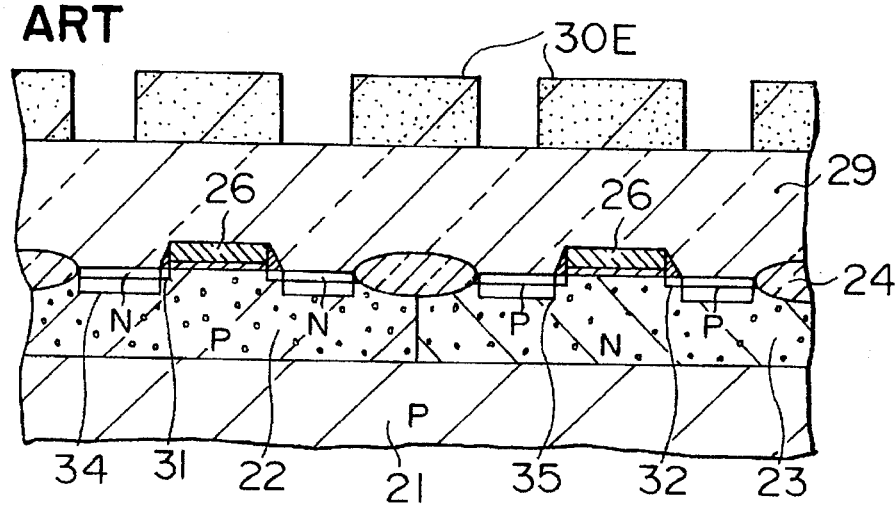
Figure 1F:
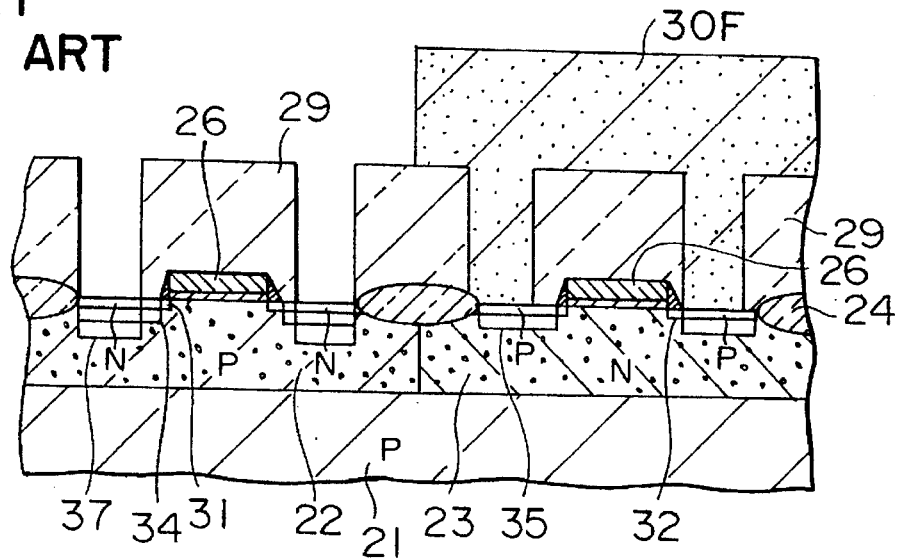
Figure 1G:
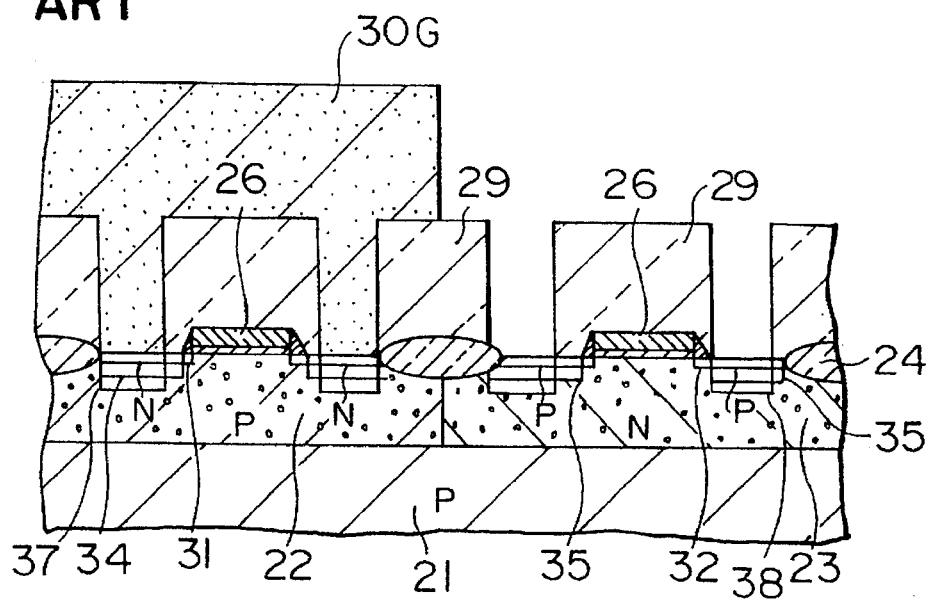
Figure 1H:
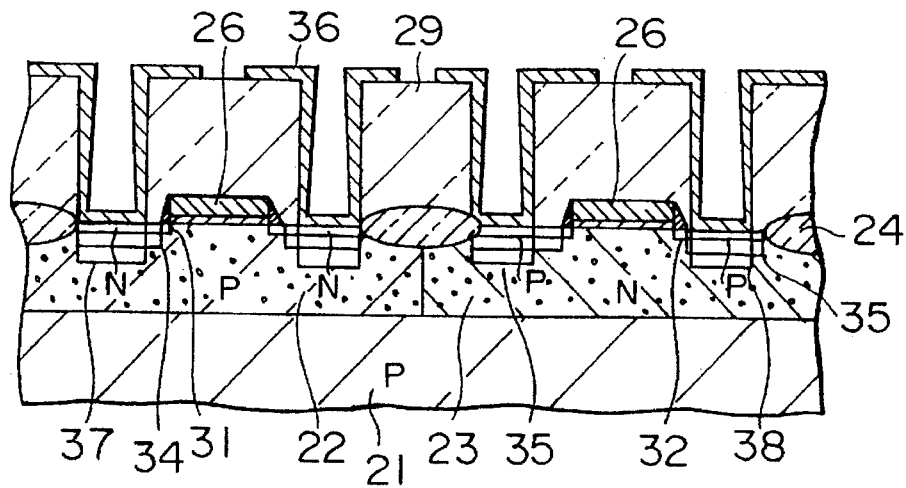
Figure 2A:
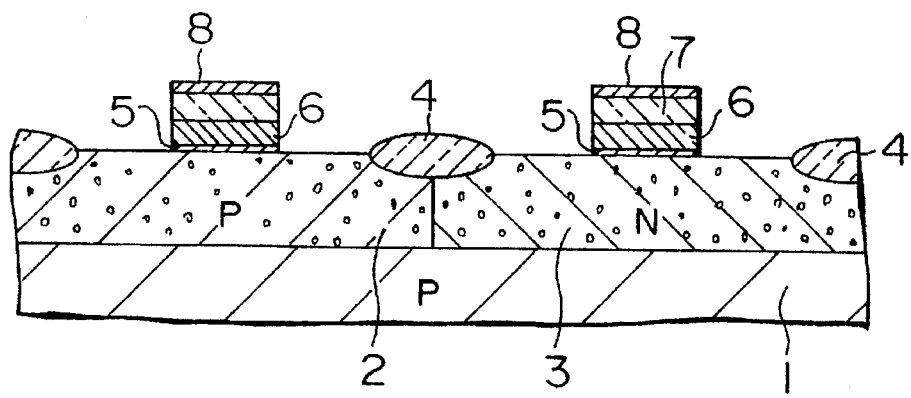
FIGS. 2A to 2H are sectional views sequentially showing the manufacturing steps of a semiconductor device according to the present invention.

The present invention will be described in detail below with reference to the accompanying drawings. FIGS. 2A to 2H are sectional views showing the manufacturing steps according to an embodiment of the present invention. As shown in FIG. 2A, boron is ion-implanted in a p-type silicon substrate 1 at 150 KeV and about 1E13 $cm^{-2}$, and phosphorous is ion-implanted only in an n-type well formation region at 150 KeV and about 2E13 $cm^{-2}$ by a lithographic process. The resultant structure is annealed to diffuse phosphorous and boron, thereby forming an n-type well region 3 and a p-type well region 2. A field oxide region 4 is formed on the p-type silicon substrate 1, and the resultant structure is isolated to form element regions. Thereafter, a gate oxide region 5, a gate polysilicon film 6, an oxide film 7, and a stopper polysilicon film 8 having a thickness of about 50 nm as a stopper film are formed in each element region. Then, the resultant structure is patterned into a predetermined shape by a lithographic process to form a gate electrode.

Figure 2B:
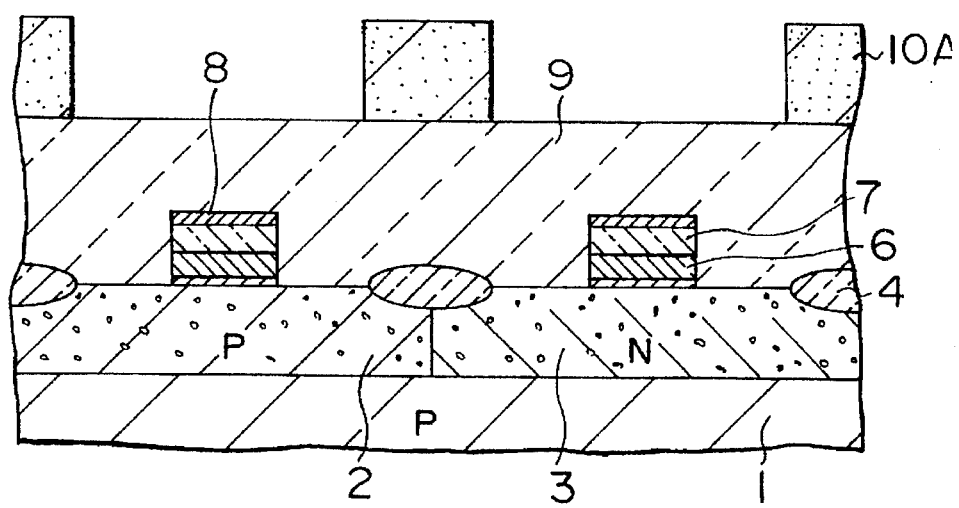
Figure 2C:
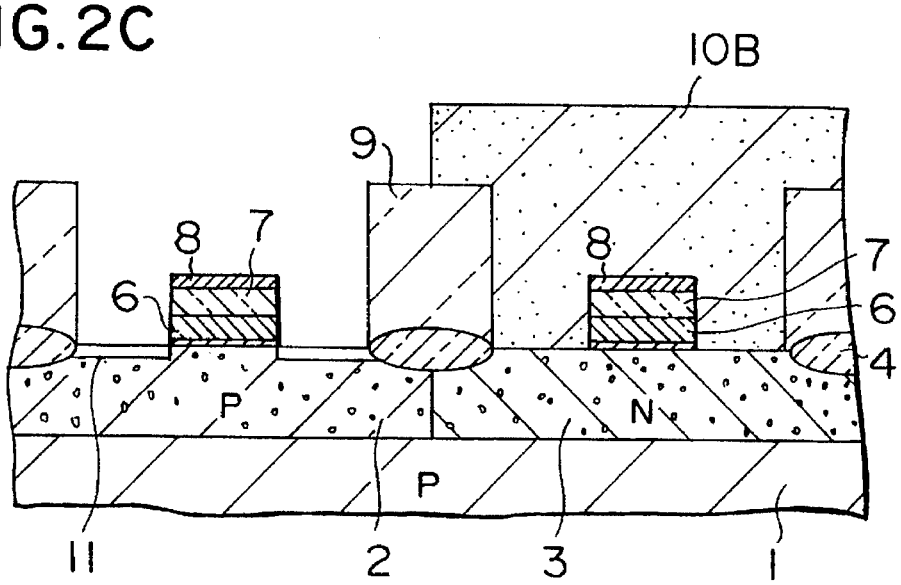

Next, as shown in FIG. 2B, an insulating interlayer 9 is deposited on the entire surface by a CVD method. The resultant structure is annealed to reflow the insulating interlayer 9. A p-type silicon substrate 10A covers the surface except for a region including a gate channel portion and source and drain regions, and the insulating interlayer 9 is etched and removed using the stopper polysilicon film 8 on the gate electrode as a stopper. With this processing, as shown in FIG. 2C, the surface of the silicon substrate 1 in regions on the two sides of the gate electrode is exposed. Then, a resist film 10B is formed in the n-type well region 3 by a lithographic process, and phosphorous is ion-implanted at 40 KeV and about 1.5E13 $cm^{-2}$. With this processing, an n-type LDD diffusion layer 11 is formed in the p-type well region 2.

Figure 2D:
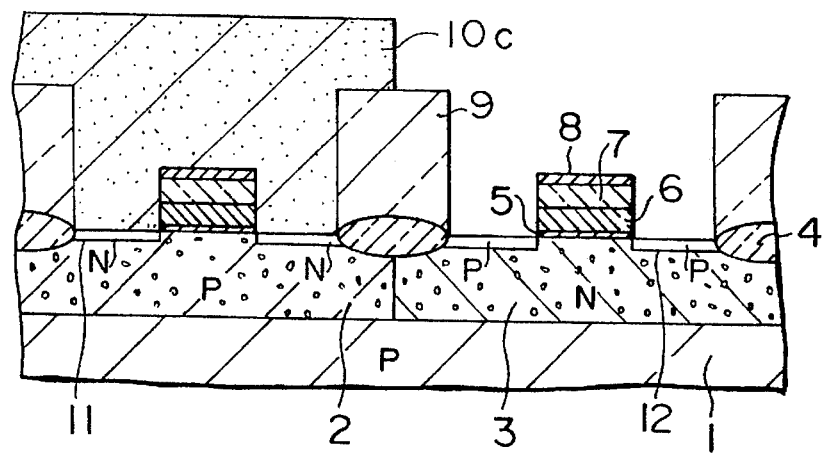

Similarly, as shown in FIG. 2D, a resist film 10C is formed in the p-type well region 2 by a lithographic process, and boron is ion-implanted at 15 KeV and 1.5E13 $cm^{-2}$. With this processing, a p-type LDD diffusion layer 12 is formed in the n-type well region 3.

Figure 2E:
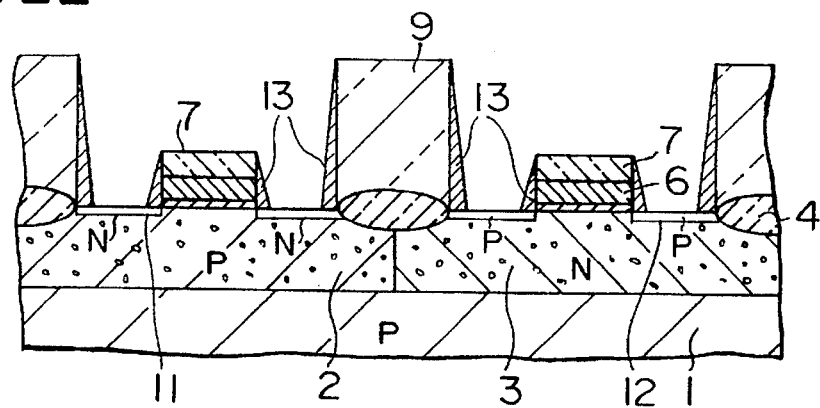
Figure 2F:
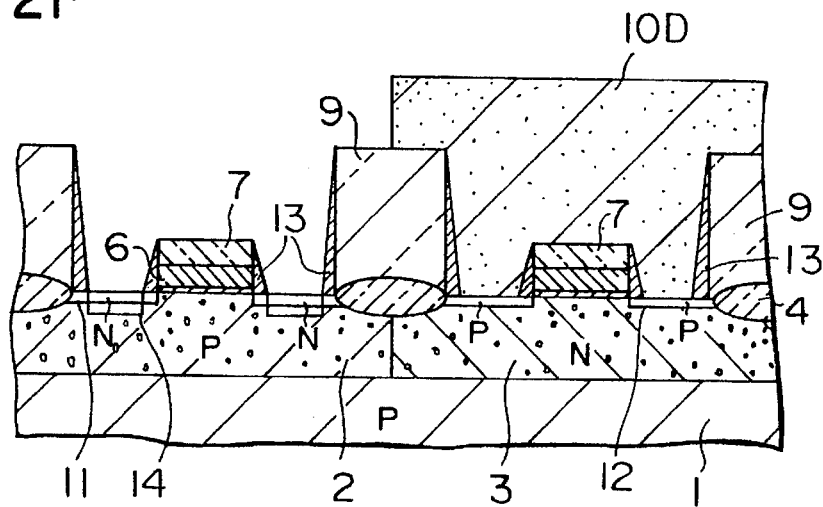

An oxide film is grown on the entire surface to have a thickness of about 200 nm, and the resultant structure is etched back to form an LDD sidewall spacer oxide film 13 on the side wall of each of the gate electrode and the insulating interlayer 9, as shown in FIG. 2E. Thereafter, the resultant structure is annealed to oxidize the stopper polysilicon film 8, thereby integrating the stopper polysilicon film 8 into the oxide film 7 as the lower layer.

Subsequently, a resist film 10D is formed in a PMOS transistor region by a lithographic process, and arsenic ions are implanted only in an NMOS transistor region at 70 KeV and about 5E15 $cm^{-2}$. With this processing, an $n^+$-type diffusion layer 14 is formed as a source/drain region by a self alignment method using the gate electrode and the sidewall spacer 13.

Figure 2G:
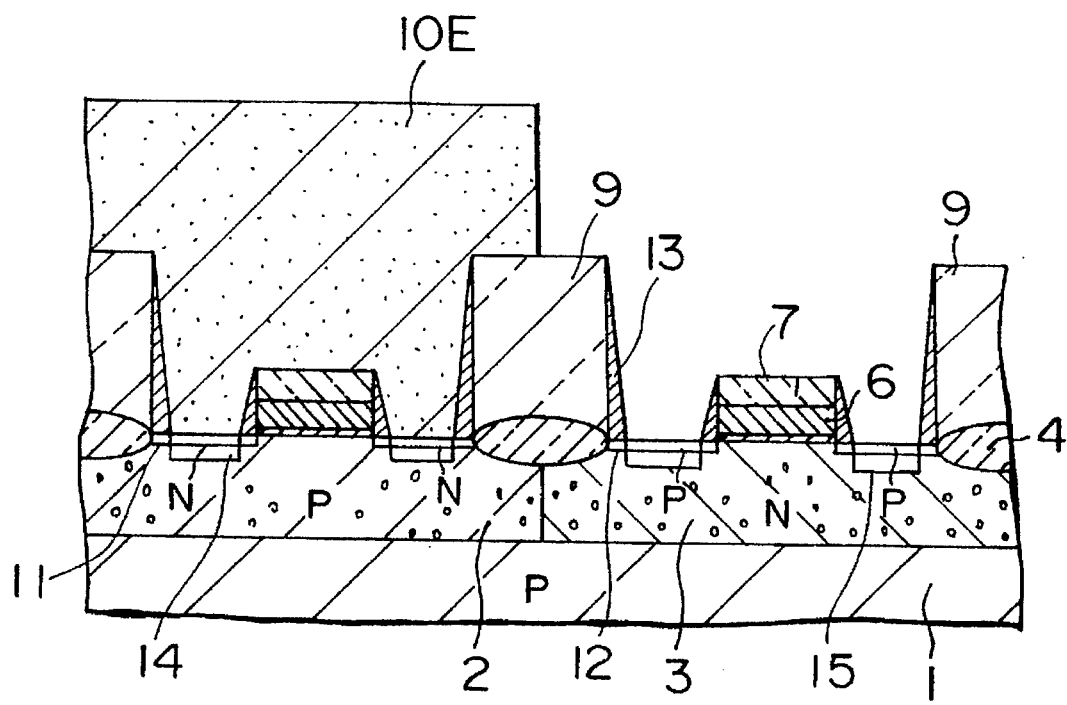

Similarly, as shown in FIG. 2G, a resist film 10E is formed in the NMOS transistor region by a lithographic process, and boron fluoride ions are implanted only in the PMOS transistor region at 30 KeV and about 5E15 $cm^{-2}$ to form a $p^+$-type diffusion layer 15 as a source/drain region. After the ion implantation, the resultant structure is annealed at about 900° C. so as to activate the diffusion layers.

Figure 2H:
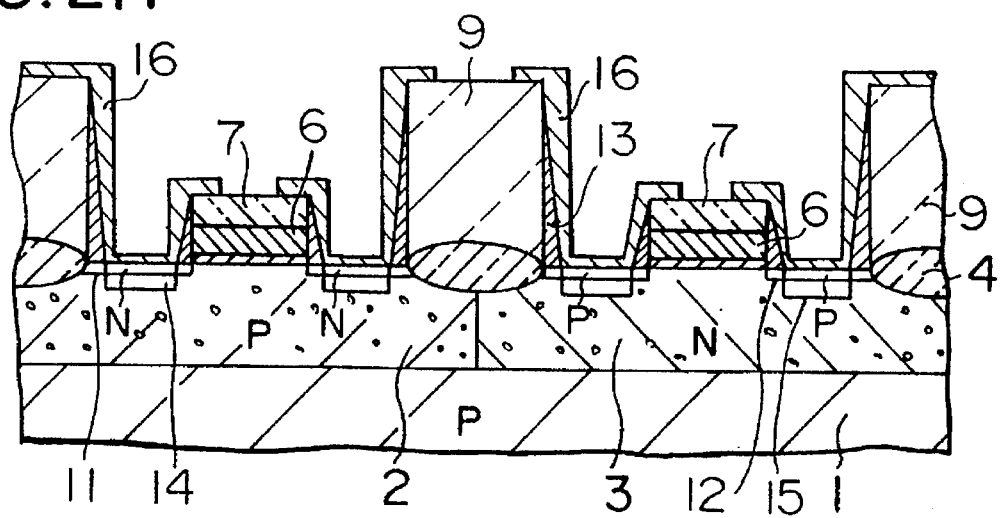

Thereafter, as shown in FIG. 2H, tungsten silicide is deposited on the entire surface by sputtering, and the resultant structure is etched by a lithographic process to form an electrode wiring 16.

With this arrangement, the MOS transistor manufactured in accordance with this manufacturing method has an arrangement wherein the region surrounded by the LDD sidewall spacer 13 formed on the sidewall of each of the gate electrode and the insulating interlayer serves as a contact hole to the electrode wiring 16. An impurity is ion-implanted through this contact hole to form the $n^+$-type diffusion layer 14 and the p⁺-type diffusion layer 15 as the source and drain regions. With this arrangement, the contact hole completely corresponds to the source/drain region, and no margin is required. Therefore, each of the diffusion layers 14 and 15 as the source/drain region can have the same size as the contact hole to the electrode wiring 16, thus realizing a micropatterned MOS transistor. On the other hand, a contact area can be increased, and a contact resistance can be reduced.

According to the manufacturing method described above, since each diffusion layer as the source/drain region corresponds to the contact hole, a contact diffusion layer required in the conventional method can be eliminated, and a lithographic process, an ion implantation process, and an annealing process for the contact diffusion layer are not required to simplify the manufacturing process. In addition, no annealing for forming the contact diffusion layer is required, and annealing for reflowing the insulating interlayer is performed before formation of the diffusion layer. For this reason, a thermal influence on the diffusion layer as the source/drain region can be avoided and, for example, the influence of the short channel effect can be eliminated.

Instead of the step of oxidizing the stopper polysilicon film 8 formed on the oxide film of the gate electrode, an etching time in etching of the insulating interlayer may be increased to etch and remove the stopper polysilicon. In this case, an etching time of the contact hole is adjusted to prevent the oxide film 7 from being etched and removed.

In this manner, when the method of etching and removing stopper polysilicon is used, another suitable material which has etching selectivity with the insulating interlayer and silicon can be used as a stopper film. Note that, in the above embodiment, the present invention is applied to the CMOS transistor. When, however, only a PMOS transistor or a NMOS transistor is formed, some of the above steps can be employed, as a matter of course.

What we claimed is:

1. A method of manufacturing a semiconductor device, comprising: the steps of sequentially forming a gate insulating film, a gate electrode, and a stopper film in an element region on a semiconductor substrate; forming an insulating interlayer on said semiconductor substrate, and etching and removing said insulating interlayer in the element region; doping an impurity into said semiconductor substrate surrounded by said gate electrode and said insulating interlayer, and forming lightly doped diffusion layers; forming a sidewall spacer on sidewalls of said gate electrode and said insulating interlayer; doping an impurity into said semiconductor substrate surrounded by said sidewall spacer, and forming heavily doped diffusion layers; and forming an electrode wiring on said semiconductor device surrounded by said sidewall spacer; and also comprising the step of removing said stopper film by etching at the same time as said insulating interlayer is etched and removed.

2. A method according to claim 1, wherein in the step of forming said lightly doped diffusion layers, phosphorous and boron are alternately ion-implanted in different surfaces of said semiconductor device respectively at 40 KeV and about 1.5E13 cm⁻² and at 15 KeV and about 1.5E13 cm⁻².

3. A method according to claim 2, wherein annealing is performed at 900° C. so as to activate said diffusion layers after ion implantation.

4. A method according to claim 1, wherein in the step of forming said heavily doped diffusion layers, arsenic and boron fluoride are alternately ion-implanted in different surfaces of said semiconductor device respectively at 70 KeV and about 5E15 cm⁻² and at 30 KeV and about 5E15 cm⁻².

5. A method according to claim 4, wherein annealing is performed at 900° C. so as to activate said diffusion layers after ion implantation.

6. A method of manufacturing a semiconductor device comprising: the steps in sequence of forming a gate insulating film, a gate electrode and a stopper film in an element region on a semiconductor substrate; forming an insulating interlayer on said semiconductor substrate, and etching and removing said insulating interlayer in the element region; doping an impurity into said semiconductor substrate surrounded by said gate electrode and said insulating interlayer, and forming lightly doped diffusion layers; forming a sidewall spacer on sidewalls of said gate electrode and said insulating interlayer; doping an impurity into said semiconductor substrate surrounded by said sidewall spacer, and forming an electrode wiring on said semiconductor device surrounded by said sidewall spacer; and wherein said stopper film comprises polysilicon, and said method further comprises the step of oxidizing the stopper film so as to integrate the stopper film into an oxide layer beneath said stopper film.

* * * * *